United States Patent [19]

d'Humieres et al.

[11] Patent Number: 4,719,412

[45] Date of Patent: Jan. 12, 1988

[54] SYSTEM FOR ANALYZING TRANSIENTS IN A NON-LUMINOUS SIGNAL

[75] Inventors: Etienne d'Humieres, Versailles; Jean M. Bernet, La Celle St. Cloud; Cregoire Eumurian, Argenteuil, all of France

[73] Assignee: Thomson CSF, Paris, France

[21] Appl. No.: 807,461

[22] Filed: Dec. 10, 1985

[30] Foreign Application Priority Data

Dec. 18, 1984 [FR] France .............................. 84 19361

[51] Int. Cl.⁴ .......................................... G01R 23/16
[52] U.S. Cl. .................................. 324/77 K; 332/7.51
[58] Field of Search ............... 350/355, 374, 384, 385, 350/393; 324/77 K, 96; 370/2; 332/7.51

[56] References Cited

U.S. PATENT DOCUMENTS

| | | | |
|---|---|---|---|
| 4,253,060 | 2/1981 | Chen | 324/77 K |
| 4,348,074 | 9/1982 | Burns | 324/77 K |
| 4,394,060 | 7/1983 | Verber | 324/77 K |
| 4,446,425 | 5/1984 | Valdmanis | 324/77 K |
| 4,456,877 | 6/1984 | Brown | 324/77 K |
| 4,514,860 | 4/1985 | Adolfsson | 324/77 K |
| 4,603,293 | 7/1986 | Mourou | 324/77 K |
| 4,626,102 | 12/1986 | Storck | 324/77 K |
| 4,633,170 | 12/1986 | Burns | 324/77 K |

FOREIGN PATENT DOCUMENTS 3127406 10/1981 Fed. Rep. of Germany .
2508754 6/1981 France .

OTHER PUBLICATIONS

1980 IEEE MTT-S International Microwave Symposium Digest, IEEE Catalog No. 77-645125, 1980, pp. 317-318, IEEE New York, U.S.; Bassen et al, "An FR Field Strength Measurement System Using an Integrated Optical Linear Modulator".

IBM Technical Disclosure Bulletin, vol. 26, No. 12, May 1984, pp. 6604-6605, New York, U.S.; Kash, "Pisosecond Streak Camera with Single Photon Sensitivity".

Advances in Instrumentation, vol. 37, part 3, 1982, pp. 1655-1671, Research Triangle Park, U.S.; Tebo, "Sensing with Optical Fibers: An Emerging Technology".

Primary Examiner—Michael J. Tokar
Attorney, Agent, or Firm—Cushman, Darby & Cushman

[57] ABSTRACT

System making it possible to analyze electrical or other transients with the aid of an easily displaceable, miniature, passive, electrically insulated sensor. It comprises a monomode laser source connected by an optical fibre to an optical transient analyzer. The sensor is formed by a circuit receiving the signal to be analyzed and making it possible to modulate the light intensity in the fibre by means of an integrated optics modulating circuit and which receives the signal in electrical form. An adapting circuit at the input makes it possible to convert the signal to be analyzed into an electrical signal, where necessary. It is constituted by a coil in the case of a magnetic field, an antenna in the case of an electrical field, a quartz in the case of a force, etc.

11 Claims, 7 Drawing Figures

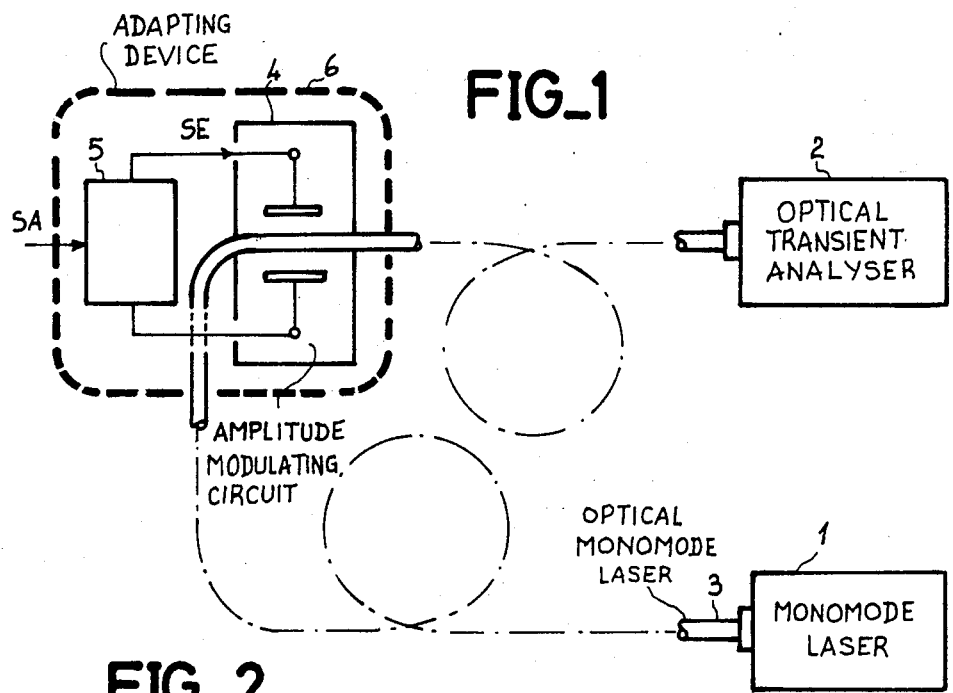
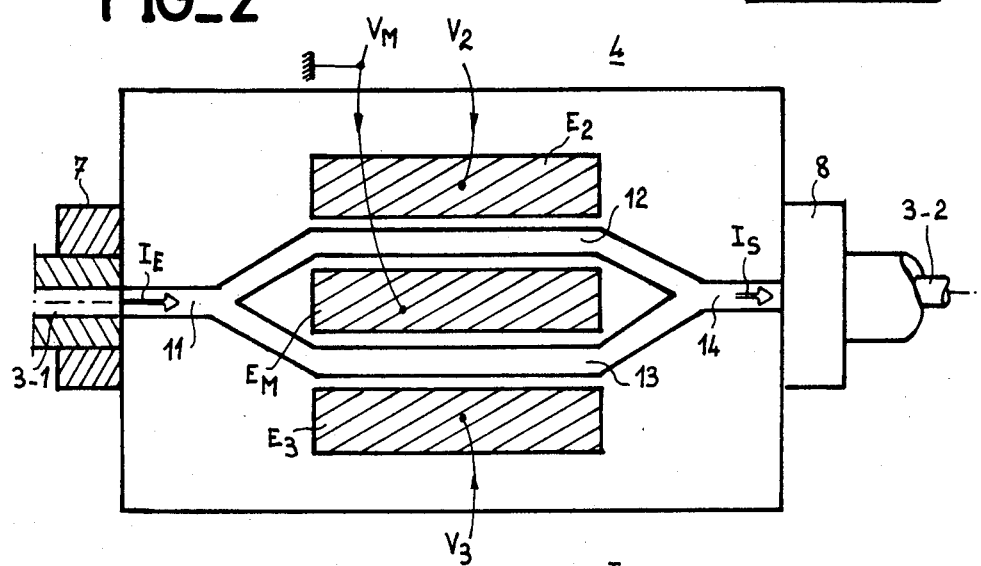
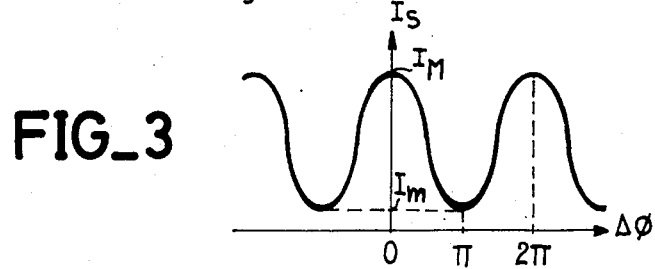

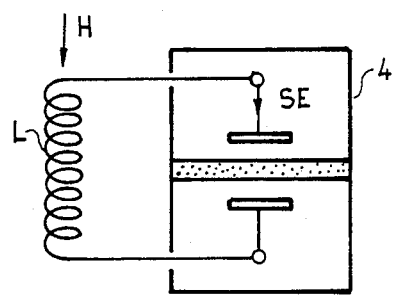
FIG_4
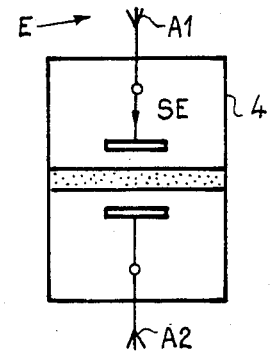
FIG_5
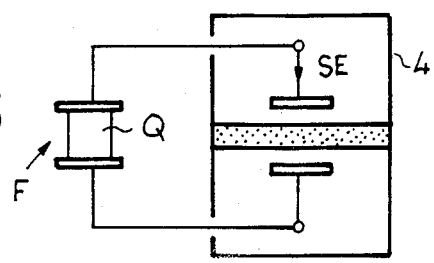
FIG_6
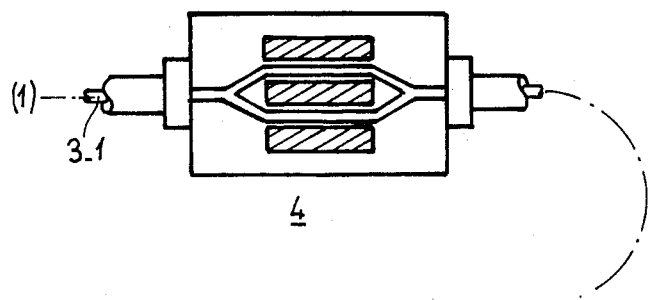
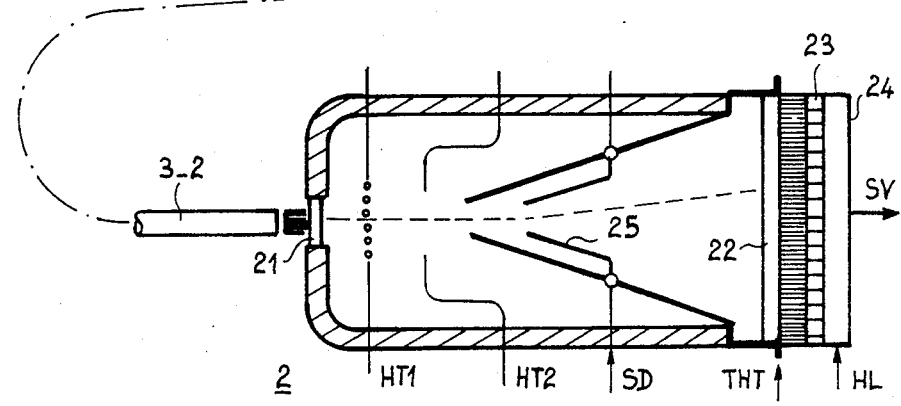
FIG_7

SYSTEM FOR ANALYZING TRANSIENTS IN A NON-LUMINOUS SIGNAL

BACKGROUND OF THE INVENTION

The present invention relates to a system which has a major application in analyzing fast transients, whereby the signals to be analyzed can have a duration between e.g. 30 picoseconds and a few nanoseconds.

For the analysis of very fast signals, it is known to a streak scanning camera associated with a television camera in a solid state circuit as the analyzer. The streak camera receives the signal to be analyzed in optical form. If the signal is of another type, e.g. electrical, it is first processed in an input interface circuit, which converts it into a calibrated optical signal. The different optical signals to be processed are transmitted via fibre optics to a streak camera. This intermediate optic can be constituted by linearly juxtaposed fibres in order to form the light slit on the input photocathode. Deflecting electrodes are controlled in order to produce a scan perpendicular to the line resulting from N juxtaposed optical channels on a fluorescent screen at the output of the tube. The resulting image formed from N vertical traces then makes it possible, by analysis with the aid of a television camera and a processing circuit, to study the time variation of the corresponding signals.

French Patent application No. 84 19196 of 12.14.1984 describes a photon sampler derived from streak cameras and arranged so as to process an optical analysis channel at the input. According to this solution, the tube is provided at the input with a photocathode having reduced dimensions and is directly associated with an image detector in a solid state circuit constituted by a single detecting strip oriented in accordance with the light trace to be detected. The assembly can be realized more compactly and has numerous advantages, particularly due to the fact that the number of samples corresponding to the number of detecting strip elements is higher than that supplied by a solid state matrix.

The object of the invention is to provide a transient analyzing system for which the signal to be analyzed can be electrical or, if it is not electrical or optical, is firstly converted into an electrical signal before being supplied to the analyzer in optical form, whereby the analyzer is advantageously of the aforementioned type used for the analysis of a single channel.

SUMMARY OF THE INVENTION

The present invention proposes an analyzing system with an adapting device, which transforms the signal to be analyzed into a light or luminous signal, a fibre light conductor making it possible to transmit the luminous signal to the input of an optical transient analyzer, the light conductor used being a monomode fibre connecting the output of a monomode laser source to the input of the optical transient analyzer and the adapting device is provided with an amplitude modulator in integrated optics for modulating the intensity of the luminous signal as a function of the electrical signal applied to the modulator. In the case where the signal to be analyzed is neither electrical nor optical, the adapting device has complementary means for converting said signal to be analyzed into an electrical modulation signal.

BRIEF DESCRIPTION OF THE DRAWINGS

The invention is described in greater detail hereinafter relative to non-limitative embodiments and with reference to the attached drawings, wherein show:

FIG. 1 A general diagram of a transient analysis system according to the invention.

FIG. 2 A known two-armed interferometer which can be used as the light intensity modulator in the system according to FIG. 1.

FIG. 3 The response curve of the interferometer according to FIG. 2.

FIG. 4 An embodiment of the light intensity modulating circuit in the form of a magnetic field sensor.

FIG. 5 A second embodiment of the light intensity modulating circuit in the form of an electric field sensor.

FIG. 6 A third embodiment of the light intensity modulating circuit in the form of a pressure sensor.

FIG. 7 A partial representation of an embodiment of the transient analysis system according to FIG. 1 using an interferometer according to FIG. 2 and a photon sampler tube as the optical transient analyzer.

DETAILED DESCRIPTION OF THE PREFERRED EMBODIMENTS

With reference to FIG. 1, the transient analyzer system comprises a monomode laser 1 connected by a monomode fibre 3 to the input of an optical transient analyzer 2. The coherent source 1 emits in a continuous manner and the signal to be analyzed SA is used in an intermediate circuit 6 for modulating the light intensity in fibre 3. This intermediate circuit 6 constitutes an interface circuit or adapting device. It essentially incorporates an amplitude modulating circuit 4 produced in integrated optical form and which makes it possible to modulate the light intensity of the optical signal as a function of variation in an input electrical signal SE applied to circuit 4. If the signal to be analyzed SA is in electrical form, it is directly applied to circuit 4. However, if it is not electrical and obviously not optical which is excluded in the present configuration, it is previously applied to a complementary circuit 5, which converts it into optical form SE usable in the light intensity modulating circuit 4.

The light intensity modulating circuit could be constituted in known manner by a two-armed interferometer, whose structure is shown in FIG. 2. It is pointed out that the monomode fibre 3 is constituted by three elements, namely an element 3.1 connecting the interferometer to the laser source 1 and an element 3.2 connecting said interferometer to analyzer 2. Circuit 6 has optical coupler means 7, 8 for appropriately coupling the ends of the monomode fibres 3.1 and 3.2 respectively to the input and output of the two-armed interferometer. The latter has a monomode waveguide branch 11 in which circulates a light wave of intensity $I_E$. Branch 11 is subdivided into two parallel arms 12, 13, which are then joined again to form an output branch 14, where it is possible to recover an intensity IS. The light propagation directions are the same in all four guides. Electrodes are arranged between guides 12 and 13, i.e. electrode $E_M$ and on either side of said two guides, i.e. electrodes $E_2$ and $E_3$. Electrode $E_1$ is connected to earth potential VM and voltages V2 and V3 are applied to electrodes $E_2$ and $E_3$. The arrangement of the electrodes adjacent to the guides lead to the formation in the latter of electrical fields perpendicular to the propagation direction of the light waves. The complete device is formed on the surface of a substrate having electrooptical properties. For voltages V2 and V3 of the same sign, the electrical fields are of opposite sensors and lead to opposite sign variations in the propagation rates of the light waves in both arms. The difference between the propagation rates is proportional to the sum of the amplitudes of the electrical fields applied, i.e. substantially proportional to the sum of voltages V2 and V3. At the output, there is a phase displacement between the two waves, which were originally in phase. The recovered intensity IS varies as a function of the phase displacement in accordance with a sinusoidal law shown in FIG. 3, whereof the intensity varies between a minimum Im and a maximum IM, the modulation ratio IM/Im being a function of the coupling losses and the asymetry of the device. In the considered application, signal SE is superimposed on one of the voltages V2 or V3, which are originally at the same potential V. For an analog signal SE, intensity IS follows the modulation, provided that the phase displacement remains between $2n\pi$ and between $(2n+1)\pi$, so as to retain a constant curve slope. It should be noted that this sinusoidal response can be linearized by adding an optoelectronic lock loop in accordance with the technology described in U.S. Pat. No. 4,288,785.

FIGS. 4 to 6 relate to examples of use of the system in various cases where the signal to be analyzed SA is not of an electrical nature.

In the example of FIG. 4 the signal to be analyzed is a magnetic field H and the input circuit 5 is constituted by a coil L in which the field H induces a current converted into an electrical signal SE usable by the modulating circuit 4. In the case of FIG. 5, the signal to be analyzed is an electrical field and the input circuit 5 is formed by antennas A1 and A2. In the case of FIG. 6 the signal to be analyzed is a force F and the circuit 5 of FIG. 1 is formed with the aid of a quartz Q.

It is pointed out that the circuit arrangements proposed according to FIGS. 4 to 6, as well as other possible arrangements for other types of signal to be analyzed, make it possible to form a sensor 6 which is easily displaceable due to the fact that it is connected to the auxiliary circuit 1 and 2 via an optical fibre, the said sensor is electrically insulated, it is miniaturized and it is passive, in view of the fact that it requires no power supply.

FIG. 7 partly shows a preferred realization of the system of FIG. 1 using a two-armed interferometer 4 for modulating the light intensity in monomode fibre 3 and in which the optical transient analyzer 2 is constituted by a photon sampler derived from streak camera tubes and specified in that it is provided at the input with a small photocathode 21 and in that its fluorescent screen 22 is directly connected to a detecting strip 23 in solid circuit. It is possible to see within the tube concentrating and focusing electrodes receiving high voltages HT1, HT2, an anode electrode supplied by a very high voltage THT and deflection electrodes 25 receiving deflection signals SD for producing the scan in the direction of the strip. Strip 23 is associated with amplification and reading circuits 24 which supply the detected video signal SV. Reading is synchronized by a local clock signal HL.

What is claimed is:

1. A transient analyzing system for the analysis of a non-luminous signal to be analyzed comprising:
an optical transient analyzer; and
means for converting the signal to be analyzed into a luminous form of information,
including (a) a monomode laser source emitting a luminous signal in a continuous manner
(b) means, coupled to receive said luminous signal, for amplitude modulating said laser luminous signal to produce said luminous form of information as an output, said producing means having an optical amplitude modulating integrated circuit with an optical input, an optical output and a modulating input, said modulating input being adapted to receive a nonluminous signal which has a characteristic varying in accordance with the signal to be analyzed
and (c) a monomode optical fibre light conductor for connecting the laser source to said optical input, and the said optical output to the optical transient analyzer.

2. A system according to claim 1, wherein said signal to be analyzed is electrical and constitutes said modulation signal, the system analyzing electrical transients.

3. A system according to claim 1, wherein said producing means accepts an electrical modulation signal and said producing means includes means for converting a signal to be analyzed which is not in electrical form into said electrical modulation signal.

4. A system according to claim 3, wherein the said producing means constitutes a small, electrically insulated, easily displaceable, passive sensor, which is provided at its optical input with a first coupler for connecting it by a first monomode fibre element to the monomode laser source and at its optical output with a second coupler for connecting it by a second monomode fibre element to the optical transient analyzer.

5. A system according to claim 4, wherein the signal to be analyzed is a magnetic field and wherein the complementary circuit is formed by a coil.

6. A system according to claim 4, wherein the signal to be analyzed is an electrical field and wherein the complementary circuit is formed by an antenna.

7. A system according to claim 4, wherein the signal to be analyzed is a force and the complementary circuit is formed by a quartz structure.

8. A system according to claim 1, wherein the amplitude modulating circuit is realized with an integrated optic, two-armed interferometer.

9. A system according to claim 8, wherein the optical transient analyzer is constituted by a photon sampler tube having an input photocathode coupled to the monomode optical fibre and whose fluorescent screen is coupled to a detecting strip, whose direction corresponds to the cathode beam deflection direction.

10. A system according to claim 1, wherein the optical transient analyzer is constituted by a photon sampler tube having an input photocathode coupled to the monomode optical fibre and whose fluorescent screen is coupled to a detecting strip, whose direction corresponds to the cathode beam deflection direction.

11. A transient analyzing system for the analysis of a non-luminous signal, including:
an optical transient analyser; and
means for converting the signal to be analyzed into a luminous form of information, including: (a) a monomode laser source emitting a luminous signal in a continuous manner; (b) an adapting device for amplitude modulating the laser luminous signal to produce said luminous form of information as an output, said adapting device having an optical amplitude modulating integrated circuit with an optical input, an optical output and a modulating input, said modulating input adapted to receive an electrical signal where amplitude varies in accordance with the variation of the signal to be analyzed, said adapting device including a complementary circuit for converting a signal to be analyzed which is not electrical into said electrical modulation signal; and (c) monomode optical fibre light conductor means for connecting the laser source to said optical input and said optical output to the optical transient analyzer, said fibre conductor means enabling said adapting device to be easily displaceable with respect to said laser source and optical transient analyzer.

* * * * *